United States Patent [19]
Ma et al.

[11] Patent Number: 5,617,090
[45] Date of Patent: Apr. 1, 1997

[54] MULTI-CHANNEL SIGMA-DELTA A/D CONVERTERS WITH IMPROVED THROUGHPUT

[75] Inventors: Fan Y. Ma, Singapore, Singapore; John J. Kornblum, Indialantic, Fla.

[73] Assignee: Harris Corporation, Melbourne, Fla.

[21] Appl. No.: 438,251

[22] Filed: May 10, 1995

[51] Int. Cl.[6] .................................................. H03M 1/00
[52] U.S. Cl. ........................... 341/141; 341/155; 341/118
[58] Field of Search .................................... 341/141, 143, 341/155, 118

[56] References Cited

U.S. PATENT DOCUMENTS

| | | | |
|---|---|---|---|
| 5,043,911 | 8/1991 | Rashid | 364/494 |
| 5,248,971 | 9/1993 | Mandl | 341/141 |
| 5,345,236 | 9/1994 | Sramek, Jr. | 341/144 |
| 5,349,352 | 9/1994 | Saleh | 341/143 |

FOREIGN PATENT DOCUMENTS

0458524A2  11/1991  European Pat. Off. .

*Primary Examiner*—Jeffrey A. Gaffin
*Assistant Examiner*—Jason L. W. Kost
*Attorney, Agent, or Firm*—Nixon, Hargrave, Devans & Doyle

[57] ABSTRACT

A sigma delta convertor 20 has a number of time slots that are programmable connectable to the input channels 200 via a multiplexer 205. Conversion throughput of any one input channel is increased by connecting two or more time slots to the input channel. For an eight input channel embodiment 800 the throughput of conversion of one input can be increased 2×, 4× or 8× by connecting, respectively, 2, 4 or all 8 time slots to the selected input channel.

21 Claims, 7 Drawing Sheets

5,617,090

MULTI-CHANNEL SIGMA-DELTA A/D CONVERTERS WITH IMPROVED THROUGHPUT

This invention relates in general to analog to digital (A/D) converters with multiplexed inputs, and, in particular, to sigma-delta A/D converters, with multiplexed inputs.

BACKGROUND

Many industrial control systems require high precision and high resolution A/D converters with low or moderate signal bandwidth. Sigma-delta A/D converters often are a cost effective solution for such requirements. In a typical application, a single A/D converter is connected to several external input channels via a multiplexer. One problem associated with converting analog signals in industrial control systems is the filtering of 50–60 Hz line noise. The individual channel throughputs of the converters are adversely impacted by line noise rejection.

Prior art high precision and high resolution sigma-delta A/D converters have multiplexers for receiving a number of external signals. A typical example of one such A/D converter is shown in U.S. Pat. No. 5,345,236. In that patent there is described a multiplexed sigma-delta A/D converter which uses averaging in order to reject line noise and improve converter throughput. So, the A/D converter separates the filtering of high frequency noise from low frequency (50/60 HZ) line noise and the high frequency noise is separately removed by a digital low pass filter. The 50/60 Hz line noise is removed by averaging each of the input channels. The averaging takes place over the typical 50/60 Hz line noise cycle. So long as the external channels are sampled at least once during each line noise quarter cycle, and so long as the sampling occurs at corresponding equally spaced time slots, line noise will be averaged out of each of the sampled external input channels. In this way, high frequency noise is removed by one filter and 50/60 Hz line noise is removed by the averaging operation so long as the conversion operation takes place within an envelope defined by the line noise, i.e. 50/60 Hz.

One of the drawbacks with such a system is that the overall throughput of any given channel is limited to 240 Hz, i.e. four (4) conversions during a cycle of a 60 Hz line or 200 Hz for 50 Hz line noise. It is often desireable to have a higher throughput, but prior art devices are limited by the restraint of equally sampling each channel during the line noise quarter cycle.

SUMMARY

The invention provides a method and apparatus for increasing the conversion throughput of a sigma-delta A/D converter. The conversion throughput is increased by providing a number of internal time slot conversion channels that are selectively connectable to the external channels. A conversion scan is one complete conversion of all internal time slots. It is a feature of the invention that all of the internal time slot channels are used and converted during a conversion scan but less than all of the external channels are used. So, two or more internal time slot conversion channels are coupled to the same external channel.

We have found that the throughput of the A/D converter in the context of line noise rejection is, in effect, limited by the number of external channels that can be converted during each line noise quarter period. For example, if there are eight external channels and eight internal time slot channels with each internal time slot channel connected to a different external channel, then during a given 60 Hz cycle, all of the eight external channels are converted four times. However, if the first four internal time slot channels are connected to the first four external channels and the second set of four internal time slot channels are also connected to the same four external channels, then each external channel will be sampled by two internal time slot channels during a given conversion scan. Accordingly, the four external channels will be sampled at twice their normal throughput. So, if half of the external channels are sampled twice during a conversion cycle, the throughput will increase by a factor of two. If only two of the external channels are sampled by all eight internal time slots, the throughput is increased by a factor of four. Finally, if only one of the external channels is sampled by all of the internal channels, then the throughput is increased by a factor of eight.

It is a technical advantage of the invention that the throughput of the multiple external channels is increased by whole integral factors by selecting less than all of the external channels for conversion, but still converting on all of the internal channels. This feature is often desireable because many A/D applications do not require all eight external channels to be converted. However, prior art devices have an internal time slot coupled to each of the external channels. Such a connection retains the same physical connection path from external channel inputs to the internals of the A/D and is not the same as connecting the same external input to two or more channel inputs. In the case of the latter approach the high throughput output will contain gain errors. In contrast, the invention provides for a programmable connection between the internal time slots and the external channels.

DETAILED DESCRIPTION

1. Sigma Delta Converters

Figure 1:
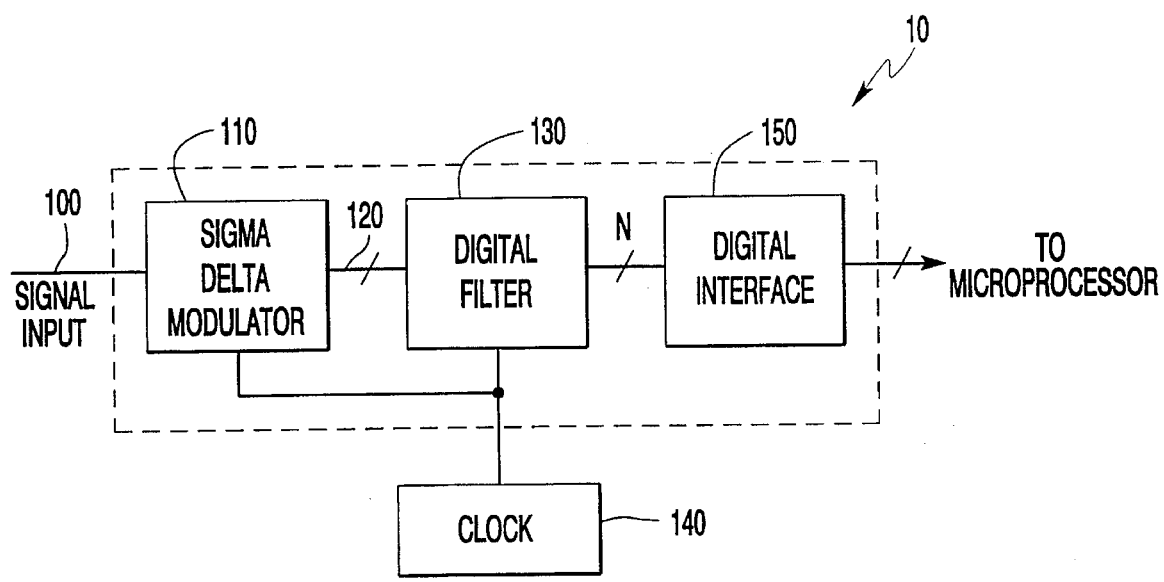
FIG. 1 shows a block diagram of a known sigma delta converter architecture used for low frequency measurements.

In a typical sigma delta converter 10, as shown in FIG. 1, an analog signal 100 is fed into the device. The signal is compared in the modulator 110 to a referenced level that converges on the analog signal 100 in a closed feedback loop to produce a one-bit data stream 120 representing the analog amplitude. The one-bit data stream 120 then goes into a digital filter 130 to remove quantization noise and other internally generated noise. According to U.S. Pat. No. 5,349,352, proper selection of a clock 140 will also allow the notch of the digital filter 130 to be at the line noise frequency (50 or 60 Hz) and allow suppression of common AC line noise picked up through inductive and capacitive coupling. In addition to removing noise, the digital filter takes the 1-bit input data stream at a high sampling rate and decimates it to an N-bit data stream at a lower sampling rate. A digital interface 150 then provides the output of the digital filter 130 to a microprocessor or microcontroller.

The theory of operation of a sigma delta converter 10 is well known. In essence, an input signal is sampled at a frequency many times higher than the highest input frequency of interest using a simple 1-bit comparator in a feedback loop. The quantization noise is broadband white noise in nature. However, it is shaped by the integration performed in the modulator so that the noise floor is much lower at lower frequencies and greater at higher frequencies out of the range of interest. The digital filter 130 then filters out this higher frequency noise allowing greater signal resolution at the low frequencies that are of interest. The actual signal-to-noise ratio and distortion specifications are a fuction of both the oversampling rate and the order of the integration in the modulator. For a specific maximum input signal frequency and modulator, the resolution of the converter can be increased by greater oversampling since the resultant quantization noise is spread over a wider bandwidth, and, even without the effect of noise shaping, each doubling of the sample rate theoretically yields a 3 dB dynamic range improvement. Modulator noise shaping depends upon the order of the modulator. For a second order modulator one would expect a theoretical dynamic range improvement of 15 dB for every doubling of the sample rate.

Figure 2:
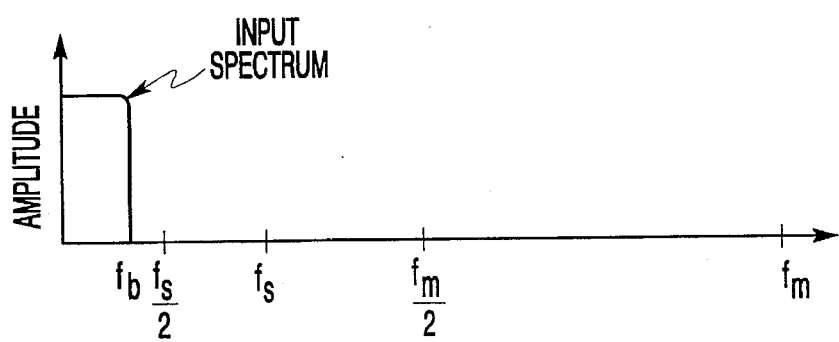
FIG. 2 illustrates the typical frequency spectrum of existing sigma delta architectures.

The typical frequency spectrum of existing sigma delta converters for low frequency measurement applications is shown in FIG. 2 with a modulator sampling rate of fm, the usable bandwidth of the 1-bit sigma delta comparator is fm/2 based on the Nyquist Sampling theorem. In the tradeoff of oversampling rate for resolution in a sigma delta converter, the effective sampling rate, fs, represents that frequency that provides the desired resolution for the maximum input signal of interest if the signal were sampled with more conventional means, such as a common successive approximation register (SAR) converter. The input signal bandwidth, fb, defines the usable range of the converter over which there must be minimal signal attenuation from the filter (fb is commonly taken as the −3 dB down point).

To assist the reader, the following table of definitions will be useful:

K is the number of samples of the channel taken in 1 period of the line noise frequency.

$F_{line}$ is the frequency of the line noise.

$N_{max}$ is the maximum number of channels that can be converted within a line noise quarter cycle.

$T_{line}$ is the period of the line noise, equal to the inverse of $F_{line}$.

$T_{conv}$ is the A/D converter's conversion time.

$N_{set}$ is the number of sets where each set comprises $N_{set\ channels}$ number of channels.

$N_{set\ channels}$ is the number of channels where each set $(1 < N_{set} < N_{max})$. $N_{set\ channels\ limit}$ will change with throughput mode.

$N_{set\ channel\ max}$ is the maximum number of channels in each set and is determined by the conversion speed and the throughput increase factor.

$N_{ch}$ is the number of channels available in a converter $(N_{ch} < N_{max})$.

$N_{throughput}$ is the throughput increase factor where the nominal case is $N_{throughput} = 1$.

$N_{comb}$ is the number of stages in a comb filter.

Figure 3A:
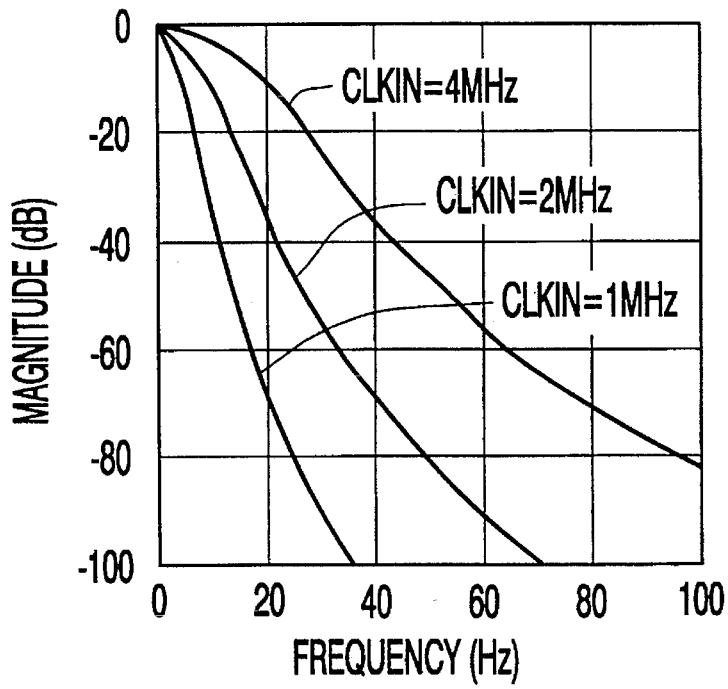
FIG. 3A shows the passband spectrum when a "brickwall" FIR filter is used to remove line noise.

For example, in FIG. 3A a finite impulse response (FIR) filter is shown with a sharp rolloff characteristic. This filter is used in the Crystal Semiconductor CS5501 sigma delta A/D converter, and fb is approximately 10 Hz when the clock crystal is 4.096 MHz. With this clock rate, the CS5501 filter provides approximately 55 dB rejection at 60 Hz to signals coming in to either the data input or reference voltage pins. With fb at 5 Hz, 60 Hz rejection increases to more than 90 dB.

Figure 3B:
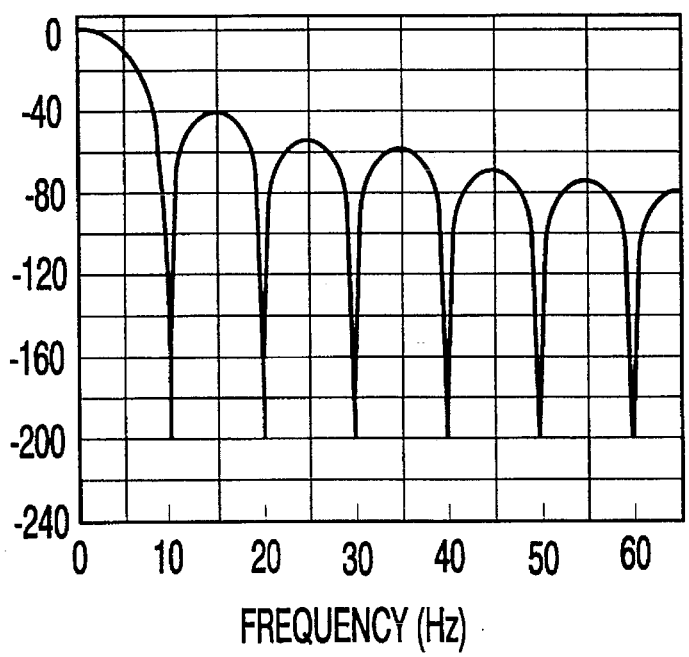
FIG. 3B shows the passband spectrum when a S/B (sin $x/x)^3$ comb filter is used to remove line noise.

As a further example, in FIG. 3B the filter characteristics of the Analog Devices AD7712 are shown. The AD7712 uses a $(\sin x/x)^3$ or $\text{sinc}^3$ comb filter to achieve acceptable fb and 60 Hz noise rejection with a simple implementation. Comb filters with N comb stages have a frequency response amplitude of approximately $$H(f) = [\sin (pi\ f/F)/(pi\ f/F)]^N$$

where f is the frequency variable and F is the first notch frequency of the comb filter.

By designing the comb filter to work with a specific clock so that the first notch frequency is an integral fraction of the AC line frequency, the rejection of AC line noise can be very high. See U.S. Pat. No. 5,349,352. The −3 dB down point of the filter then establishes the usable frequency range without detrimental signal attenuation. For a comb with F=60 Hz and N comb=1, the −3 dB point is at f=26.5 Hz. Slowly varying DC signals, such as temperatures or pressures, with a signal bandwidth up to 26 Hz can therefore be converted without detrimental signal attenuation.

2. Programmable Time Slots

Figure 4:
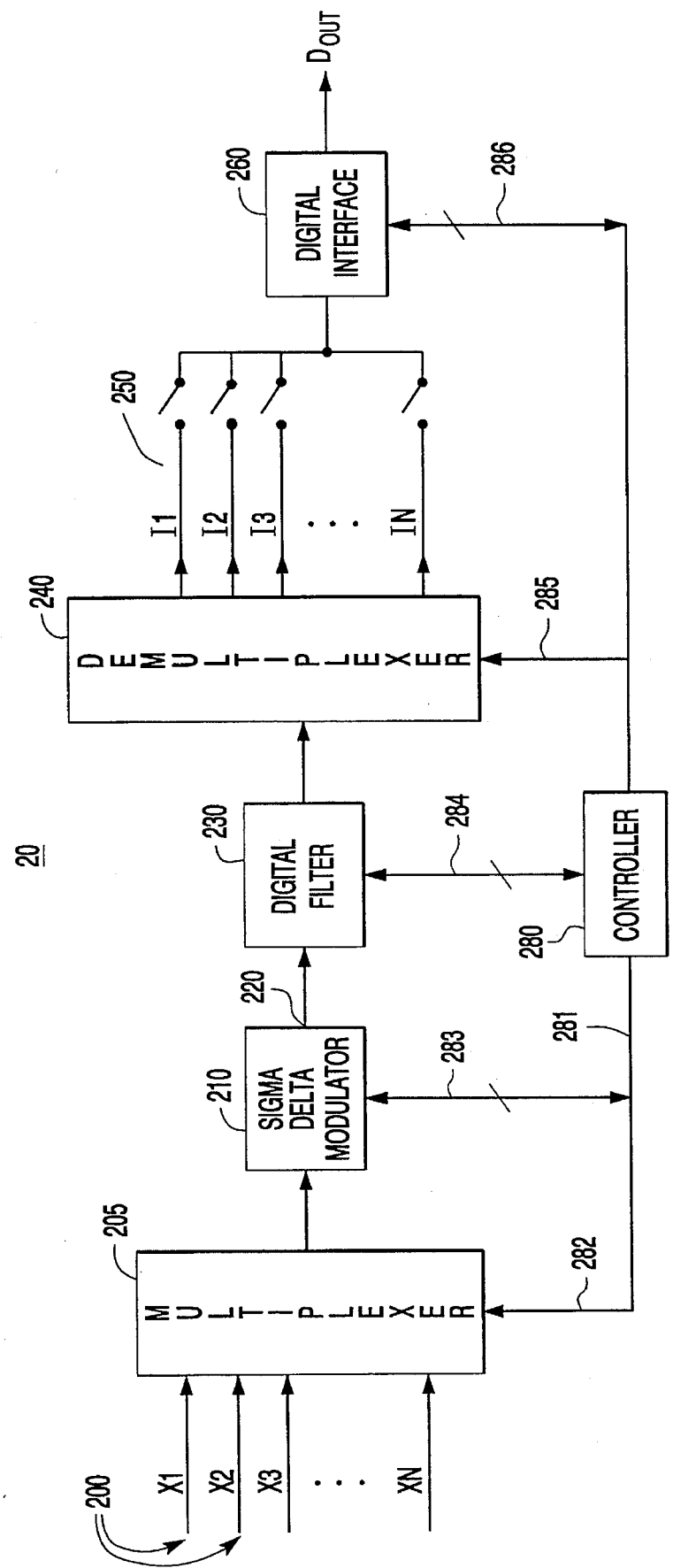
FIG. 4 shows the architecture of a first preferred embodiment sigma delta converter.

FIG. 4 shows a first preferred embodiment sigma delta converter 20 with input signals 200 fed into a multiplexer 205 for selection. The modulator 210 provides a one-bit digital data stream 220 representing the amplitude of the selected signal to the digital filter 230. The digital filter 230 in this architecture, however, is designed to only filter out quantization and other relatively higher frequency (100 Hz or more) internally generated noise. The output of the digital filter 230 is then put into demultiplexer 240 to feed a bank of data channel registers 250 where the data from the last 4N throughput conversions of individual channels-is accumulated. Data for each channel is averaged to remove AC line noise on a per channel basis, and the final digital signal, thus filtered for both external and internal noise, is made available to a microprocessor through the digital interface 260.

With reference to FIG. 4, the controller 280 outputs a control signal onto control bus 281 for input to the multiplexer 205 via multiplexer input control line 282. The control signal on control line 282 will indicate which of the external channels X1-XN are to be selected for conversion. During a given conversion scan, if it is desired to increase throughput, the number of selected external channels will be less than the number of internal channels. Referring to Table 1, depending on the number of external channels selected, the external channel may be selected for conversion one or more times during a given line noise quarter cycle. So, if $N_{set}$ channels is selected to be 6, then each selected external channel will be converted twice ($N_{set}$=2) during each line quarter quarter cycle to provide moving average of 8 samples and a throughput of 480 Hz. For a set of 6 channels, each channel must be converted twice during a line quarter quarter cycle. On the other hand, if it is desired to increase the throughput by 7 times, then seven (7) time slots ($N_{set}$=7) are allocated to one external channel ($N_{set\ channels}$=1). As such, the external channel will be sampled 7 times during each line noise quarter cycle, there are four line noise quarter cycles so the moving average is 28 and the throughput is 1,680 Hz. For the invention, the number of time slots can be selected as well as the number of external channels.

Figure 5:
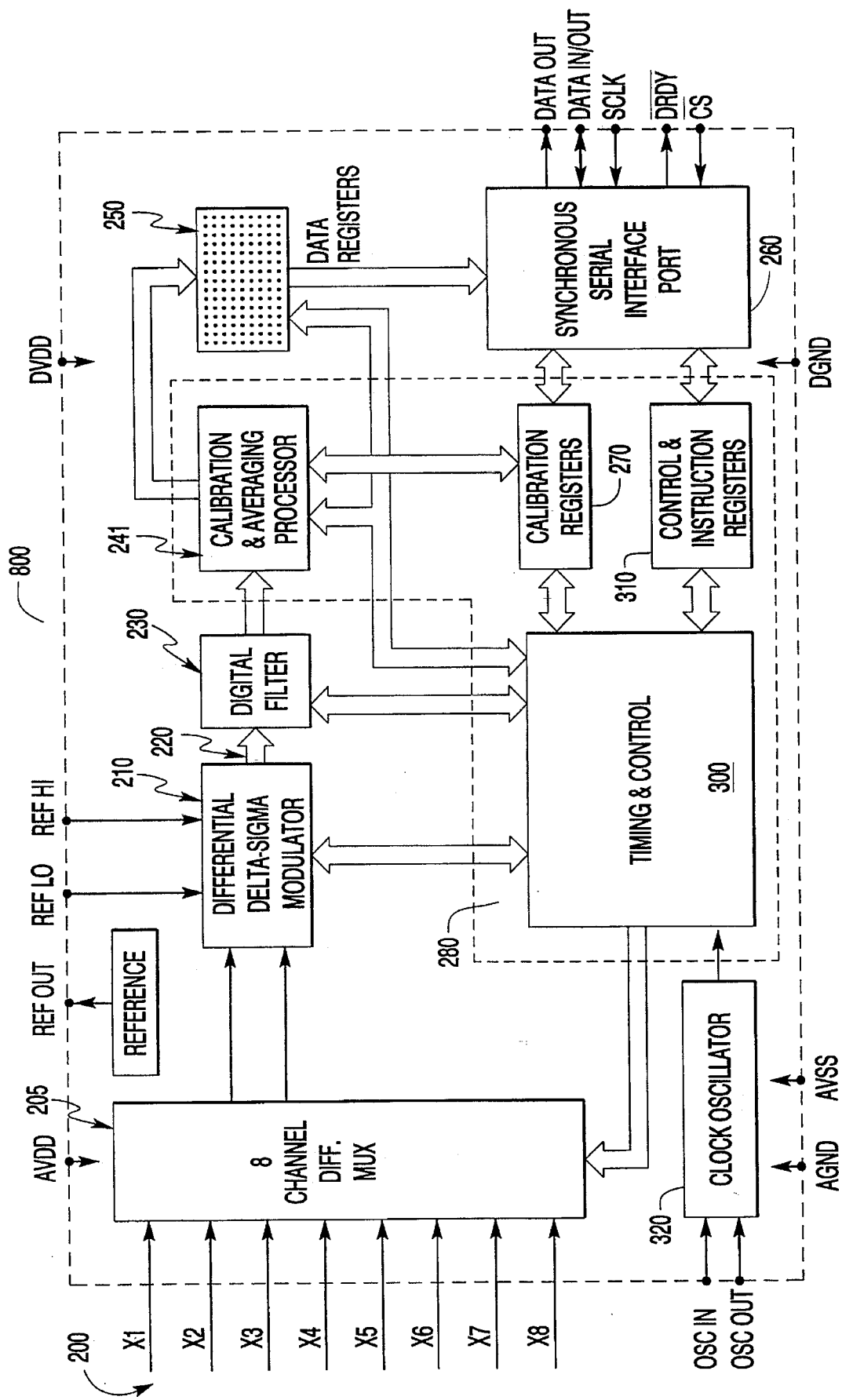
FIG. 5 shows the architecture of a second preferred embodiment sigma delta converter.

FIG. 5 shows a second preferred embodiment of an 8-channel multiplexed sigma delta converter 800 in simplified block form. Elements common to converters 20 and 800 have the same reference numerals as elements of FIG. 4; note that multiplexer 240 of FIG. 4 appears in calibration and averaging processor 241 of FIG. 5. The converter of FIG. 5 sequentially samples each of the 8 inputs for durations of about 625 microseconds for 50 Hz line noise or 520 microseconds for 60 Hz line noise. This yields 500 or more samples per channel to compute each one of the outputs of filter 230 to average in processor 241 when the sampling frequency of modulator 210 is 1 MHz.

At the end of the each sampling the multiplexer 205 switches to another channel and the cycle repeats for this channel. Note that filter 230 has decimated the sampling rate by a factor of 500 (from 1 MHz to 2000 Hz) because filter 230 only provides one output for every 500 data sample inputs.

Because the input for each channel may be anywhere in the voltage range defined by the voltages at terminals REF LO and REF HI, the multibit output may be conveniently offset and scaled prior to output. For example, with positive and negative inputs, two's complement output format may be convenient. Such calibration is programmed through interface 260 to load calibration values in registers 270. Processor 241 uses the calibration values in registers 270 to calibrate in addition to computing the averages.

In the converter 800 the electronics and fabrication are substantially simplified, compared to Converter 20 of FIG. 4, by manufacturing the A/D converter 800 with a fixed or predetermined number of time slots mad a selectable or programmable number of external channels. So, turning to FIG. 5, there are eight (8) time slots, each formed by a first-in-first-out register in a register stack 250. During a conversion scan any selected number of the eight time slots may be converted. So, in order to control the throughput, the timing and control device 300 selects a binary integral number of external channels X1–X8. In other words, the timing control device 300 will select 8, 4, 2, or 1 external channels. Conversion will be accomplished in accordance with Tables 2–5. So, for normal throughput, each external channel will be converted during a conversion scan and its conversion results will be stored as a digital value in one of the FIFO registers in stack 250. When four (4) external channels are selected, the four (4) channels will be sampled twice during a conversion scan. The results for one channel will be stored in FIFO register 1 and 5, the results for a second channel will be stored in FIFO register 2 and 6, etc. Corresponding samplings and storings for two selected channels and one selected channel will be made as shown. Respectively, in Tables 4 and 5.

In operation, a user selects the number of input channels for conversion and enters the selection via the synchronous serial interface port 260 or other suitable input means. The selected input channels are converted from analog values to digital values during the eight respective time slots. The converted digital values are stored in the FIFO registers on register stack 250. The sequence in which the selected input channels are converted is also programmable.

Figure 6:
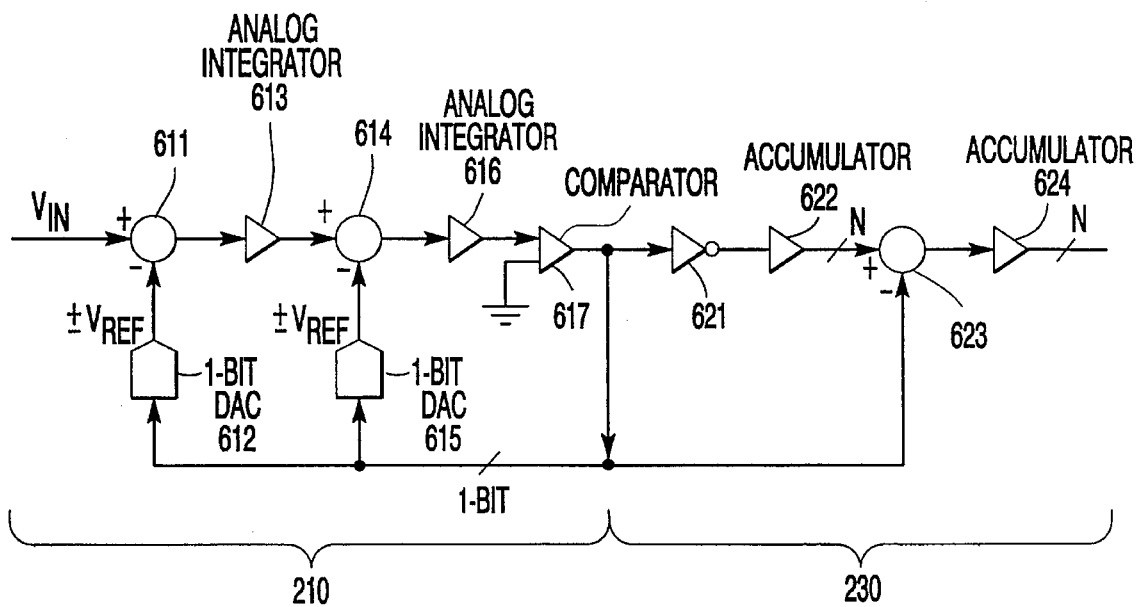
FIG. 6 shows a modulator and filter for use in the converter of FIG. 5.

FIG. 6 schematically shows a second order modulator 210 and filter 230 for use in the converter of FIG. 5. The second order modulator 210 and filter 230 were derived from the U.S. Pat. No. 5,345,236. Note that the clock and reset circuitry has been omitted from FIG. 6 for clarity. Modulator 210 in FIG. 6 operates as follows. At each clock period analog summing junction 611 adds input signal Vin to the negative of the output of digital-to-analog converter (DAC) 612. DAC 612 is a 1-bit converter and outputs either +Vref or −Vref. Analog integrator 613 adds the output of summing junction 611 to its current sum and outputs the new sum to summing junction 614. Summing junction 614 adds the sum from integrator 613 to the negative of the output of DAC 615 which duplicates the output of DAC 612. Analog integrator 616 adds the output ofjunction 614 to its current sum and outputs its new sum to comparator 617. Comparator 617 compares the sum to analog 0.0 and outputs a digital+1 if the sum is nonnegative and outputs a digital −1 if the sum is negative. (Comparator 617 could output +1 and 0 and processor 241 will provide the compensation for the average being ½ rather than 0.) The output of comparator 617 feeds back to drive DAC 612 and DAC 615. This negative feedback keeps the magnitudes of the analog sums in integrators 613 and 616 to less than 2 Vref. Note that only analog integrators and digital accumulators are used, and the filter has no multiplications and no stored coefficients to be read from memory.

The output of comparator 617 is filtered by digital filter 230 which includes inverter 621 feeding digital accumulator 622 and digital summing junction 623 combining the output of accumulator 622 and comparator 617 to be accumulated by output digital accumulator 624. The sum in accumulator 622 lies in the range of −M to +M after M clock periods from a reset, and thus the output to summing junction 623 is multi-bit. Similarly, the sum in accumulator 624 lies in the range of −M(M−1)/2 and +M(M−1)/2 after M clock periods from a reset. Note that integrators 613 and 616 may have their gains scaled for convenience, and in this case the accumulators 622 and 624 should have corresponding scaling. Indeed, with a second order modulator, a gain of ½ for each of integrators 613 and 616 is convenient. The magnitude of Vin is taken to be in the range −Vref/2 to +Vref/2 with Vref a reference voltage. The two digital accumulators of filter 230 correspond to the two analog integrators m modulator 210, and filter 230 runs "in parallel" with modulator 210. On reset the integrators and accumulators are all set to 0 (analog or digital), and thus after M clock periods the analog sum in integrator 613 is:

$$\Sigma Vin(j)-C(j)Vref \text{ sum for } j=0,1,\ldots M$$

where Vin(j) is the input signal at the start of the jth clock period and C(j) is the output of comparator 617 (+1 or −1). Analogously, the sum in corresponding accumulator 622 after M clock periods is:

$$\Sigma-C(j) \text{ sum for } j=0,1,\ldots M$$

The gain of integrator 613 and accumulator 622 have been omitted for clarity. In a similar fashion, the analog sum in integrator 616 is:

$\Sigma[\Sigma Vin(k)-C(k)Vref]-C(j)Vref$ double sum for $k=0,1,\ldots j$; and $j=0, 1,\ldots M$ and the digital sum in corresponding accumulator 624, called D(M), is:

$D(M)=\Sigma[\Sigma-C(k)]-C(j)$ double sum for $k=0,1,\ldots j$; and $j=0,1,\ldots M$ Thus the sum in integrator 616 can be expressed in terms of the sum in accumulator 624:

$\Sigma\Sigma Vin(k)+D(M)Vref$ double sum for $k=0,1,\ldots j$; and $j=0,1,\ldots M$ Recall that Vin is essentially constant during the M clock periods if the total integrating and accumulating time is small, for example 500 microseconds, because Vin is slowly varying but with 60 Hz noise. Thus with Vin constant, the Vin(k) factors out of the summations, and the sum in integrator 616 then can be expressed in terms of the sum in accumulator 624 as $VinM(M-1)/2+D(M)Vref$ But the sum in integrator 616 has a magnitude of at most 2 Vref due to the negative feedback, and M(M−1)/2 is growing as $M^2$, thus D(M) is also growing as $M^2$ and Vin is approximated by $-D(M)Vref/[M(M-1)/2]$. The sum in integrator 616 essentially is the approximation error, which is just the quantization noise. Thus the approximation error has relative magnitude decreasing like $M^{-2}$. This means 16-bit resolution requires M to be roughly $2^8-2^9$ which implies 256–512 samples; of course, including the integrator gain factors will change this somewhat. With a modulator sampling rate fm of 2.56–5.12 Hz, the 256–512 samples can be taken in 100 microseconds. This permits generation of 20 filtered output samples from each of the 8 channels during one period of the 60 Hz line frequency. Thus processor 241 could insure rejection of 60 Hz line noise plus several higher harmonics by averaging 20 filter outputs. Alternatively, more channels or higher resolution could be used with an averaging of only 4 samples by processor 241. Note that higher order modulators and filters, such as three analog integrators in series in modulator 210 plus three corresponding digital accumulators in filter 230, can provide higher resolution. And the same analysis applies for a 50 Hz power line frequency.

The synchronization of the converter clock with AC power line frequency as described in the cross-referenced patent application of Saleh may also be applied to the embodiments of FIGS. 4 and 5. This will insure rejection of AC power line noise by the averaging in registers 250 or processor 241.

3. Increasing Throughput

Figure 7:
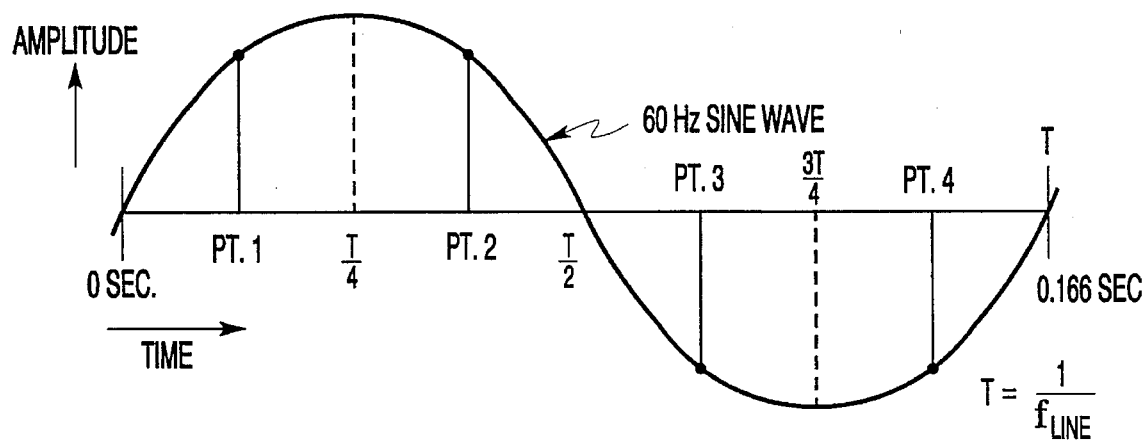
FIG. 7 shows waveform sampling that will provide an averaged result capable of attenuating line frequency signals.

The idea of using averaging to implement line noise rejection allows increased throughput at expense of the number external channels. In A/D 20 or 800 with eight input channels each coupled to a separate time slot, one can achieve a throughput of $4\times N_{throughput}$ 4 the line frequency since 4 samples/channel are taken for each cycle of the line frequency i.e. one channel sample is taken during each line noise quarter cycle (see FIG. 7). This invention provides a way of improving throughput so that more samples/channel can be taken while maintaining line rejection.

Figure 8:
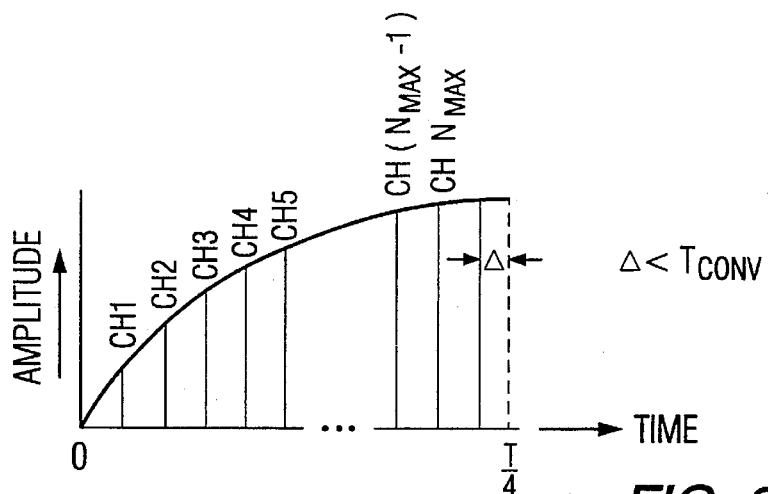
FIG. 8 shows a waveform of conversion time limits for n number of channels in a quarter line noise cycle.
Figure 9:
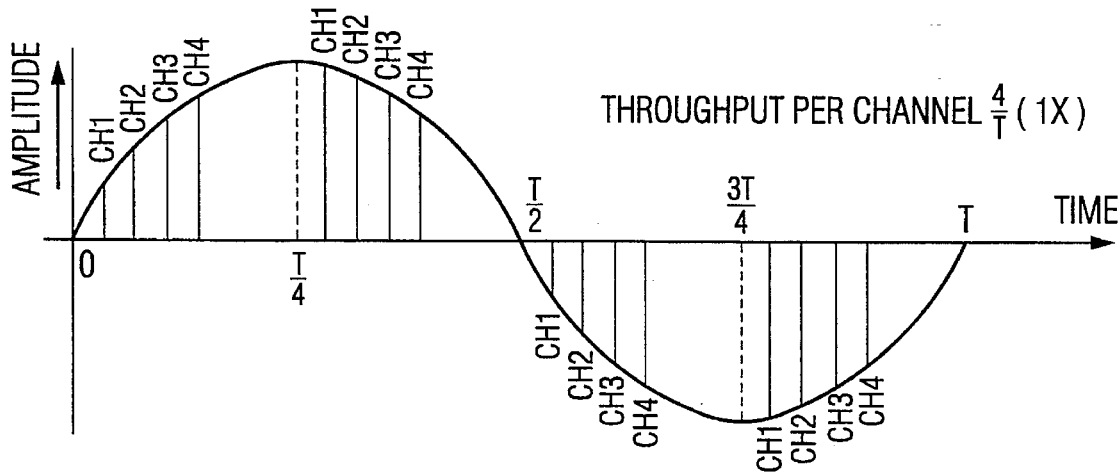
FIG. 9 shows a waveform for n channels synchronized to begin every $^T$Line/4 seconds.

The conversion speed of the converter 20 or 800 sets the limit on the number of channels that can be converted during each line noise quarter noise period $N_{max}$=floor$[T_{line}/(4\times Tconv)]$ where floor[X] refers to the largest integer not exceeding X and is also the maximum number of channels that can be multiplexed with line noise rejection (see FIG. 8). One method converts the channels sequentially with the first channel synchronized to the start of each line noise quarter cycle (see FIG. 9). Note that the number of channels may be less than the maximum number of channels that can fit within one line noise quarter cycle. This method works but limits each channel throughput to be 4× line noise frequency independent of the number of channels used ($N_{ch}$).

Figure 10:
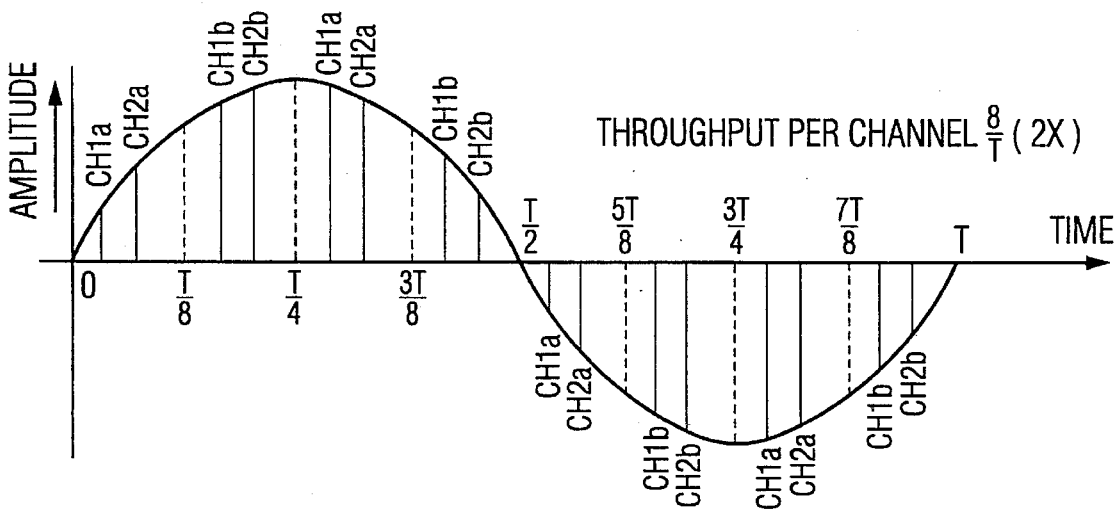
FIG. 10 shows a waveform of channel conversions synchronized to begin every $^T$Line/8 seconds.

This invention increases the channel throughput by reducing $N_{set\ channels}$, in other words, increasing $N_{set}$ and synchronizing the first channel of the set with respect to the start of an integral fraction of line noise quarter cycle. For example, to increase the throughput of each channel by $N_{throughput}$ times, then the first channel in the set must be synchronized to the start of 1/N of line noise quarter cycle. The moving average of the last 4N throughput samples constitutes the output with line noise rejection. Naturally as N throughput increases $N_{set}$ increased and $N_{set\ channels}$ decreases because the number of channels that can fit within 1/N throughput of quarter mains cycle decreases (see FIG. 10). Note that synchronization is required to maintain uniform time sampling. In a hardware implementation this can be quite involved as there is a need to keep track of $N_{throughput}$, $N_{set}$ and $N_{set\ channels}$ and adjust the channel sample timing and moving average divisor accordingly. Table 1 shows the throughput increase using this approach for $f_{LINE}$=60 Hz, $T_{conv}$=1/3000

TABLE 1

| | | Throughput Increase vs Channels Used | | |
|---|---|---|---|---|
| $N_{set}$ | $N_{set\ channels}$ | Moving Averages | Thoughput/Hz | $N_{throughput}$ |
| 1 | 8 | 4 | 240 | 1 |
| 2 | 6 | 8 | 480 | 2 |
| 3 | 4 | 12 | 720 | 3 |
| 4 | 3 | 16 | 960 | 4 |
| 5 | 2 | 20 | 1200 | 5 |
| 6 | 2 | 24 | 1440 | 6 |
| 7 | 1 | 28 | 1680 | 7 |
| 8 | 1 | 32 | 1920 | 8 |

Figure 11:
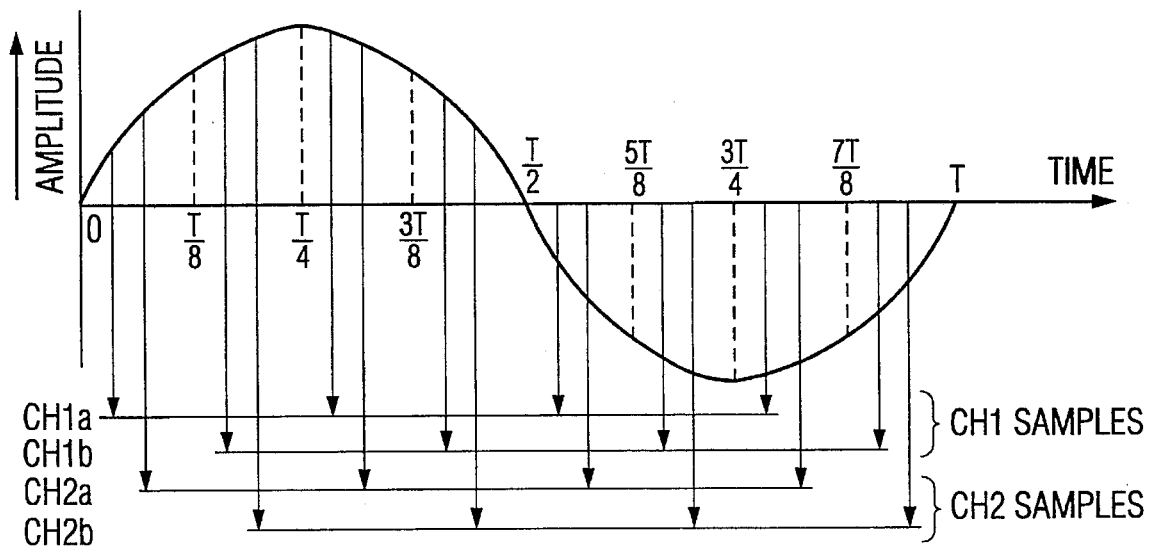
FIG. 11 shows a waveform of 2× channel throughput with four samples in the moving average.

The general implementation of the invention is simplified by noting that there is no real need to take the moving average of the last 4N throughput samples in high throughput mode. In addition, most A/D applications do not require use of all input channels and further noting that most A/D converters (including converters 20, 800) have eight input channels. From the time relationship of the samples one may continue to use a marking average of the last 4 corresponding samples (see FIG. 11 ). These corresponding channel samples are obtained by selecting the same channel outputs time offset by a line noise quarter cycle. In this case the converter will produce a stream of high throughput line rejected channel samples and the user picks the appropriate output samples corresponding to each channel. Similarly, we can use the moving average of any 2 samples time offset by a line noise half cycle.

Figure 12:
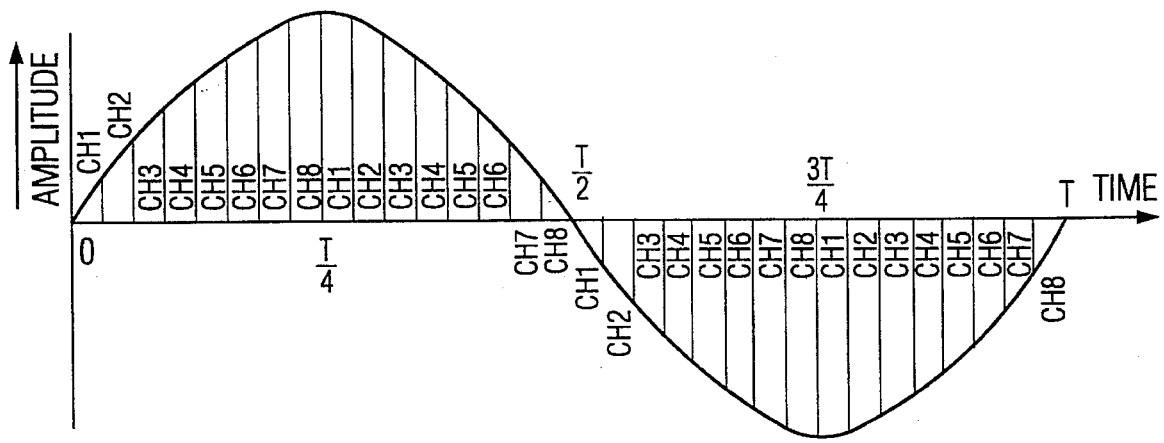
FIG. 12 shows a waveform of channel conversions synchronized every $^T$Line/32 seconds.

These ideas are used in one method where the number of channels is evenly time sampled in a line noise quarter cycle with the hardware taking the average of the last 4 or 2 samples of each channel. If all channels are distinct i.e. connected to separate external channels the throughput of each channel is 1×. If two (2) sets of channels are present ($N_{set}$=2), then throughput is doubled. At the extreme where the same external channel is connected to all internal channels then throughput is $N_{ch}x$. Note that if $N_{ch}$ is a power of 2 then a binary increase in throughput is obtained. In this implementation, throughput rate increase is limited to certain rates i.e. N is not any arbitrary integer (see FIG. 12). The advantage of this implementation is that the same hardware and timing is used independent of the throughput increase mode. This is illustrated in the following tables. Note that one does not connect the external channels to multiple internal channels as the internal channel differences will cause inaccuracies. The tables basically indicate how the internal channel time slots are utilized and if channel 1 is allotted to slots 1 and 5 (as in Table 3) then the same channel 1 connection is used.

TABLE 2

1x Throughput Configuration ($N_{set} = 1$, $N_{set\ channels} = 8$)

| External Channel | Internal Channel Slot |
|---|---|
| 1 | 1 |
| 2 | 2 |
| 3 | 3 |
| 4 | 4 |
| 5 | 5 |
| 6 | 6 |
| 7 | 7 |
| 8 | 8 |

TABLE 3

2x Throughput Configuration ($N_{set} = 2$, $N_{set\ channels} = 4$)

| External Channel | Internal Channel Slot |
|---|---|
| 1 | 1 |
| 2 | 2 |
| 3 | 3 |
| 4 | 4 |
| 1 | 5 |
| 2 | 6 |
| 3 | 7 |
| 4 | 8 |

TABLE 4

4x Throughput Configuration ($N_{set} = 4$, $N_{set\ channels} = 2$)

| External Channel | Internal Channel Slot |
|---|---|
| 1 | 1 |
| 2 | 2 |
| 1 | 3 |
| 2 | 4 |
| 1 | 5 |
| 2 | 6 |
| 1 | 7 |
| 2 | 8 |

TABLE 5

8x Throughput Configuration ($N_{set} = 8$, $N_{set\ channels} = 1$)

| External Channel | Internal Channel Slot |
|---|---|
| 1 | 1 |
| 1 | 2 |
| 1 | 3 |
| 1 | 4 |
| 1 | 5 |
| 1 | 6 |

TABLE 5-continued

8x Throughput Configuration ($N_{set} = 8$, $N_{set\ channels} = 1$)

| External Channel | Internal Channel Slot |
|---|---|
| 1 | 7 |
| 1 | 8 |

Having thus described preferred embodiments of the invention, those skilled in the art will appreciate that further changes, modifications, substitutions, and additions may be made to the embodiments without departing from the spirit and scope of the invention as set forth in the following claims.

What we claim is:

1. A method for converting analog signals to digital signals in the presence of line noise, for filtering line noise of a known line noise frequency ($F_{line}$) and for increasing the throughput of conversion of an analog to digital converter having a first number of internal time slots conversion channels selectively connectable to a first number of external channels comprising the steps of:

(a) selecting an integral number of sets ($N_{set}$) of internal time slot conversion channels, each set comprising a number of internal time slot channels $N_{set\ channels}$) equally spaced within a line noise quarter cycle and equally spaced across a line noise quarter cycle boundary each internal time slot conversion channel connected to one of the selected external channels:

(b) convening the internal time slot channels of each of the sets four (4) times during each line noise cycle;

(c) synchronizing the conversions to the line noise quarter cycle; and (d) taking the moving average of the latest $4N_{set}$ conversions of each set for performing noise filtered conversions at a throughput rate of $4N_{set\ channels}xF_{line}$.

2. The method of claim 1 further comprising the steps of altering the duration of the time slots during a line noise quarter cycle.

3. The method of claim 1 further comprising the steps of reducing the number of sets of internal time slots in order to increase the throughput of the converter.

4. The method of claim 1 further comprising the steps of taking $4N_{throughput}$ moving averages of the sets, where $N_{throughput}$ is the integral increase in throughput.

5. The method of claim 1 further comprising the steps of synchronizing the first internal time slot channel of each set with an integral fraction of the line noise quarter cycle.

6. The method of claim 5 further wherein the integral fraction is $1/N_{throughput}$ where $N_{throughput}$ is the integral increase in throughput.

7. The method of claim 1 wherein each set has the same number of internal time slot conversion channels ($N_{set\ channels}$), said number of sets ($N_{set}$) equal to or less than said first number of internal time slot conversion channels and said number of internal time slot conversion channels equal to $N_{set}xN_{set\ channels}$.

8. The method of claim 1 wherein each time slot has a duration equal to the period of the line noise cycle ($T_{line}/4$) divided by the number of sets of internal time slot conversion channels ($T_{line}/(4N_{set}xN_{set\ channels})$).

9. The method of claim 1 wherein the number of sets is less than the number of internal time slot conversion channels.

10. A sigma delta analog to digital converter for converting analog signals to digital signals in the presence of line noise, for filtering line noise of a known line noise frequency ($F_{line}$) and for increasing throughput of conversion comprising:

(a) a first number of input channels for receiving analog signals;

(b) a first number of internal time slots, each time slot for sampling an analog signal;

(c) means for programmably coupline one or more time slots to selected input channels to form an integral number of sets of time slots ($N_{sets}$), each set comprising a number of internal time slot channels ($N_{set\ channels}$) equally spaced within a line noise quarter cycle and equally spaced across a line noise quarter cycle boundary, each internal time slot connected to one of the selected external channels;

(b) means for converting the internal time slot conversion channels of each of the sets four (4) times during each line noise cycle;

(c) means for synchronizing the conversions to the line noise cycle; and (d) means for taking the moving average of the latest $4N_{set}$ conversions of each set for performing noise filtered conversions at a throughput rate of $4N_{set} \times F_{line}$.

11. The sigma delta analog digital converter of claim 10 having (a) eight input channels; and (b) eight time slots for sampling an analog signal and for converting the sampled signal into a digital signal.

12. The sigma delta analog to digital converter of claim 11 wherein two sets of four internal time slots are coupled respectively each to four different input channels.

13. The sigma delta analog to digital converter of claim 11 wherein four sets of two internal time slots are coupled respectively each to two different input channels.

14. The sigma delta analog to digital converter of claim 11 wherein one set of eight internal time slots is coupled respectively to one input channel.

15. The sigma delta analog to digital converter of claim 10 further comprising means for storing the last four values of the output (separated in time by $T_{line}/4$) of each internal time slot and means for averaging the last four stored values of each internal time slot.

16. The apparatus of claim 10 wherein each set has the same number of internal time slot conversion channels ($N_{set\ channels}$), said number of sets ($N_{set}$) equal to or less than said first number of internal time slot conversion channels and said number of internal time slot conversion channels equal to $N_{set} \times N_{set\ channels}$.

17. A sigma delta analog to digital converter comprising:

a number of external channels each channel carrying an analog signal and selectable for conversion;

a number of time slots, all time slots having an identical programmable duration and each time slot programmably connectable to an external channel;

programming means for programmably connecting one or more sets of time slots to external channels, each set of time slots comprising the same number of time slots as the other sets and each set of time slots connected to a different channel.

18. The sigma delta analog to digital converter of claim 17 further comprising means for programmably changing the duration of the time slots.

19. The sigma delta analog to digital converter of claim 17 wherein the programming means connects one or more of the internal times slots to one of the external channels to increase throughput of conversion of said external channel by a factor corresponding to the number of internal time slots connected to the external channel.

20. The sigma delta analog to digital converter of claim 17 wherein two or more time slots are connected to each selected external channel.

21. The sigma delta analog to digital converter of claim 17 wherein each selected channel is converted at a plurality of equally spaced times during a low frequency noise cycle in order to provide an average of zero line noise for said conversions during a full cycle of said line noise.

* * * * *